(12) United States Patent
Kuznetsov

(10) Patent No.: US 9,954,124 B1
(45) Date of Patent: Apr. 24, 2018

(54) THERMO-COMPENSATED SILICON PHOTO-MULTIPLIER WITH ON-CHIP TEMPERATURE SENSOR

(71) Applicant: Evgeny N. Kuznetsov, Huntsville, AL (US)

(72) Inventor: Evgeny N. Kuznetsov, Huntsville, AL (US)

(73) Assignee: Board of Trustees of the University of Alabama, for and on behalf of the University of Alabama in Huntsville, Huntsville, AL (US)

( * ) Notice: Subject to any disclaimer, the term of this patent is extended or adjusted under 35 U.S.C. 154(b) by 0 days.

(21) Appl. No.: 15/600,301

(22) Filed: May 19, 2017

Related U.S. Application Data

(63) Continuation-in-part of application No. 15/227,500, filed on Aug. 3, 2016.

(60) Provisional application No. 62/460,545, filed on Feb. 17, 2017, provisional application No. 62/276,502, filed on Jan. 8, 2016.

(51) Int. Cl.
| | |
|---|---|
| *G01T 1/24* | (2006.01) |
| *H01L 31/024* | (2014.01) |
| *H01L 27/144* | (2006.01) |
| *H01L 31/02* | (2006.01) |
| *H01L 31/028* | (2006.01) |
| *H01L 31/107* | (2006.01) |
| *G01J 1/44* | (2006.01) |

(52) U.S. Cl.
CPC .............. *H01L 31/024* (2013.01); *G01J 1/44* (2013.01); *G01T 1/244* (2013.01); *G01T 1/248* (2013.01); *H01L 27/1446* (2013.01); *H01L 31/028* (2013.01); *H01L 31/02027* (2013.01); *H01L 31/107* (2013.01); *G01J 2001/444* (2013.01); *G01J 2001/448* (2013.01); *G01J 2001/4466* (2013.01)

(58) Field of Classification Search
CPC ........................... G01T 1/1644; G01T 1/2018
See application file for complete search history.

(56) References Cited

PUBLICATIONS

Licciulli et al., "An active compensation system for the temperature dependence of SiPM gain," Feb. 2015, IEEE Transaction on Nuclear Science, vol. 62, No. 1, pp. 228-235.*

(Continued)

*Primary Examiner* — Kiho Kim
(74) *Attorney, Agent, or Firm* — Maynard Cooper & Gale, P.C.; Jon E. Holland

(57) ABSTRACT

A silicon photomultiplier (SiPM) device is provided with a SiPM matrix and a temperature compensation circuit fabricated on a substrate. The temperature compensation circuit can include a temperature sensor, a bias adjustment circuit and a current source. The current source can provide a current to the temperature sensor and the temperature sensor can provide a temperature dependent signal to the bias adjustment circuit. The bias adjustment circuit can adjust a bias voltage provided to the SiPM matrix in response to the signal from the temperature sensor in order to maintain a predefined overvoltage value at the SiPM matrix.

20 Claims, 11 Drawing Sheets

(56) References Cited

PUBLICATIONS

Baszczy et al., "Compensation of the temperature flucations in the silicon photomultiplier measurement system," May 24-26, 2012, Warsaw, Poland, 19th International Conference "Mixed Design of Integrated Circuits and Systems", pp. 300-303.*

Piemonte et al., "Characterization of the first prototypes of silicon photomultiplier fabricated at ITC-irst," Feb. 2007, IEEE Transactions on Nuclear Science, vol. 54, No. 1, pp. 236-244.*

* cited by examiner

THERMO-COMPENSATED SILICON PHOTO-MULTIPLIER WITH ON-CHIP TEMPERATURE SENSOR

CROSS-REFERENCE TO RELATED APPLICATIONS

This application claims the benefit of U.S. Provisional Application No. 62/460,545, entitled "Thermo-Compensated Silicon Photo-Multiplier with On-Chip Temperature Sensor," and filed Feb. 17, 2017, and is a continuation-in-part of application Ser. No. 15/227,500, entitled "Thermo-Compensated Silicon Photo-Multiplier with On-Chip Thermistor," and filed Aug. 3, 2016, which claims the benefit of U.S. Provisional Application No. 62/276,502, entitled "Thermo-Compensated Silicon Photo-Multiplier with On-Chip Thermistor," and filed Jan. 8, 2016, all of which applications are hereby incorporated by reference in their entirety.

BACKGROUND

The present application generally relates to a thermo-compensated silicon photo-multiplier with an on-chip temperature sensor.

A silicon photo-multiplier (SiPM) is a solid state detector with a matrix of avalanche photodiodes operated in a Geiger mode. SiPMs have been actively used in new photodetectors due to their excellent characteristics for detection of low intensities of light. The SiPMs can be used in physics experiments, aerospace applications and medical applications due to their compact size, good single photon counting resolution, high photon detection efficiency (e.g., up to 60%), high gain (e.g., up to $10^6$), and insensitivity to magnetic fields. However, a limitation of SiPMs is that several important characteristics of the SiPM, such as gain, noise and photon detection efficiency, have a significant temperature dependence.

There are several approaches that can be used to design systems to mitigate the temperature dependence in SiPMs. For example, thermo-compensating systems can use temperature control, control of SiPM dark current and/or control of the SiPM bias voltage with respect to temperature in order to reduce the temperature dependence in SiPMs. The current thermo-compensating systems generally require additional resources, increase total power consumption and are not optimal for photodetectors that have many SiPM chips with different parameters such as breakdown voltage, leakage current and gain.

SUMMARY

Silicon photomultipliers (SiPM) can be operated at bias voltages that exceed the breakdown voltages of the SiPMs by an overvoltage value. In one embodiment, the overvoltage value can range from about 2V to about 5V, although other values for the overvoltage value can be used. To stabilize the gain and the photon detection efficiency of the SiPM over the operating temperature range for the SiPM, the bias voltage applied to the SiPM matrix must be adjusted as the SiPM breakdown voltage changes due to temperature fluctuations in order to keep the overvoltage value constant. In other words, the SiPM gain and photon detection efficiency do not change with temperature if the overvoltage value is kept constant.

The present application generally pertains to a device with a silicon photo-multiplier (SiPM) matrix and a temperature compensation circuit that incorporates a temperature sensor with a chain of serially connected p-n junctions (or silicon diodes) manufactured on the same substrate as the SiPM matrix. The forward voltage of each junction or silicon diode can have a temperature dependence of about $-2.35$ mV/° C. In other words, the forward voltage of the silicon diode can either increase or decrease by 2.35 mV for each degree of temperature change from 0° C. The forward voltage, and its corresponding temperature dependence, of several serially connected diodes can be proportionally bigger than that of a single diode. For example, ten serially connected diodes can have a temperature dependence of about $-23.5$ mV/° C., which corresponds to the sum of the individual forward voltage temperature dependencies of the connected junctions or diodes. The number of junctions or diodes in the chain can be selected such that the temperature dependence of the total forward voltage of the junctions or diodes matches the temperature dependence of the breakdown voltage of the SiPM matrix. A bias adjustment circuit can be used to adjust the bias voltage applied to the SiPM matrix according to the temperature drift of the SiPM breakdown voltage as determined by the temperature sensor (i.e., the chain of junctions or diodes). The bias adjustment circuit can be fabricated on the same substrate with SiPM matrix in one embodiment, but may be located "off-chip" in other embodiments. The temperature compensation circuit can include a current source that supplies current to the chain of junctions or diodes. The current source can be fabricated on the same substrate with SiPM matrix in one embodiment, but may be located "off-chip" in other embodiments.

The present application also generally pertains to a device with a silicon photo-multiplier (SiPM) matrix and a thermo-compensating resistor manufactured on the same chip using standard CMOS technology. The thermo-compensating resistor can be either an N-well or P-well on-chip resistor and can be chosen to have a temperature dependence coefficient higher than the temperature dependence of the SiPM matrix breakdown voltage by a factor of about 1.5 to about 10. Both terminals of the thermo-compensating resistor are routed to outer pins of the chip. In one embodiment, one terminal of the thermo-compensating resistor is connected to the SiPM matrix cathode and the other terminal is connected to ground. A bias voltage can be applied to the thermo-compensating resistor at the SiPM cathode via an external resistor (i.e., not on the chip with the thermo-compensating resistor) with a low temperature dependence coefficient, e.g., $\pm 5$ ppm/° C., resistor. The use of the external resistor forms a resistive divider for the bias voltage and serves to adjust the resulting bias voltage applied at the SiPM cathode to have a temperature dependence at about the same level as the temperature dependence of the SiPM matrix breakdown voltage. The use of the external resistor for scaling eliminates the requirement to manufacture the thermo-compensating resistor with a temperature dependence coefficient exactly matching the temperature dependence of the SiPM matrix breakdown voltage.

Since the thermo-compensating resistor is made on the same substrate as the SiPM matrix, the thermo-compensating resistor can track or sense exactly the temperature of the SiPM chip. For easier setting of the SiPM overvoltage value (the difference between the bias voltage and the breakdown voltage), a terminal of the thermo-compensating resistor can be connected to ground via another resistor with low temperature dependence. The use of a ground resistor with the thermo-compensating resistor allows the maintaining of a constant overvoltage value and therefore a stable SiPM gain and photon detection efficiency for operation at average light intensities below about 100,000 photons per second. The bias voltage can be adjusted in accordance with parameters (e.g., breakdown voltage, gain) of the given SiPM chip to provide improvement for multichannel systems, which include many SiPM chips with different parameters. In other words, the bias voltage can be individually adjusted for each SiPM chip. In another embodiment, for higher light intensities (above approximately 1 million photons per second) or a large SiPM leakage current, the thermo-compensating resistor can be connected via an additional external resistor to a stable reference voltage instead of the bias voltage supply. The voltage potential at the thermo-compensating resistor is then used to control the output voltage of the bias power supply.

One advantage of the present application is that it keeps production costs low by not requiring any changes to the technological process of SiPM manufacturing.

Another advantage of the present application is that it eliminates the need for complicated systems to stabilize SiPM gain, does not require extra power and does not increase size or cost.

A further advantage of the present application is that the thermo-compensating system does not depend on the SiPM leakage current and integral light intensity.

Other features and advantages of the present application will be apparent from the following more detailed description of the identified embodiments, taken in conjunction with the accompanying drawings which show, by way of example, the principles of the application.

BRIEF DESCRIPTION OF THE DRAWINGS

Wherever possible, the same reference numbers are used throughout the drawings to refer to the same or like parts.

DETAILED DESCRIPTION

Figure 1:
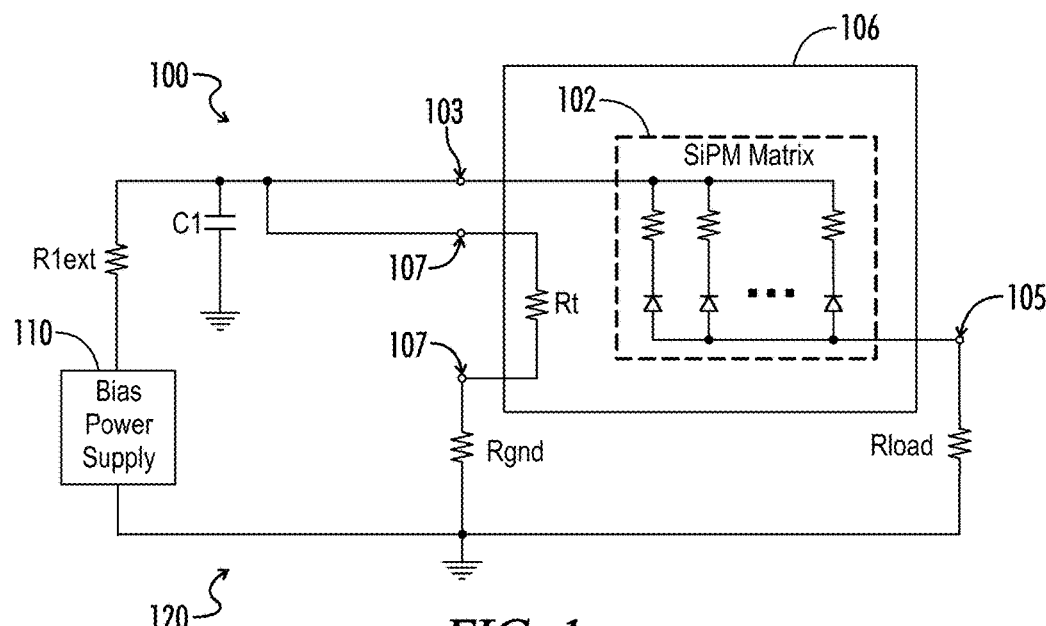
FIG. 1 is a circuit diagram of an embodiment of a device with a silicon photomultiplier (SiPM).

The present disclosure is directed to a device, such as photodetector, that has a silicon photo-multiplier (SiPM) matrix and at least a temperature sensor manufactured on a single chip (the SiPM chip) using standard CMOS technology. The device can also include a bias adjustment circuit or a compensation circuit that is used to adjust the bias voltage provided to the SiPM matrix in response to temperature changes. The device can further include a current source that can be used to provide current to the temperature sensor. Each of the bias adjustment circuit and the current source may be manufactured on the SiPM chip with the temperature sensor and the SiPM matrix. However, the bias adjustment circuit and the current source are not required to be on the SiPM chip and may be manufactured on other chips or substrates and connected to the SiPM chip.

In one embodiment, the device can have a semiconductor substrate which contains the SiPM matrix and a temperature compensation (or thermo-compensation) circuit. The temperature compensation circuit can include three modules: an adjustment circuit; a temperature sensor and a current source which supplies current into the temperature sensor. The bias adjustment circuit can control the bias voltage applied at the SiPM matrix in accordance with the signal from temperature sensor. The temperature sensor can incorporate a certain number of serially connected diodes with the last diode in the chain being connected to the current source. Each diode can have a temperature dependence coefficient for its forward voltage of about −2.35 mV/° C. A number of serially connected diodes can be selected such that their total temperature dependence (i.e., the sum of the individual temperature dependencies) compensates for the temperature dependence of the SiPM breakdown voltage having the opposite sign. For example, if the temperature dependence of SiPM breakdown voltage is positive (i.e., increases as the temperature increases), then the total temperature dependence of the diodes should be negative (i.e., decreases as the temperature increases).

In multichannel photodetectors, individual SiPM chips and SiPM matrices can have slightly different breakdown voltage parameters. If a common power supply is used to provide the bias voltage to all the SiPM matrices, differences in the breakdown voltages of the SiPM matrices can lead to different overvoltage levels of individual SiPM matrices (or channels) and consequently to varying SiPM gains in the SiPM matrices. To overcome the variances in breakdown voltages, a resistor can be connected in series with the diodes of the temperature sensor. The value of the resistor connected to the temperature sensor or the current provided to the resistor can be adjusted for each individual SiPM chip to obtain the same overvoltage value for all SiPM matrices while using a common bias power supply for a multichannel system.

In another embodiment, the temperature sensor can be a resistor Rt manufactured on the SiPM chip using standard CMOS technology. The on-chip resistor Rt can be either an N-well or P-well resistor with a temperature coefficient of resistance (TCR), or temperature dependence coefficient, higher than the temperature dependence of the SiPM matrix breakdown voltage (TCU_br) by a factor of about 1.5 to about 10, although other factors are possible.

Since the on-chip resistor Rt is made on the same substrate as the SiPM matrix, the on-chip resistor can track or sense exactly the temperature of the SiPM chip. The bias voltage for the SiPM matrix can be adjusted in accordance with parameters such as the breakdown voltage or gain of the SiPM matrix on the SiPM chip. The adjustment of the bias voltage can be used in multichannel systems, which include many SiPM chips with SiPM matrices having different parameters.

Both terminals of the on-chip resistor Rt can be routed to outer pins of the SiPM chip. One of the terminals of the on-chip resistor Rt can be connected to ground via a ground resistor Rgnd for use in setting the SiPM matrix overvoltage value. The ground resistor Rgnd can be a low TCR resistor that, when used with the on-chip resistor Rt, enables the maintaining of a constant overvoltage value for the SiPM matrix and therefore a stable SiPM matrix gain and photon detection efficiency for operation at average light intensities below about 100,000 photons per second. The other terminal of the on-chip resistor Rt can be connected to a bias voltage in a first embodiment and to a stable reference voltage in a second embodiment.

In a first embodiment, the on-chip resistor Rt can be connected to the cathode of the SiPM matrix. The cathode of the SiPM matrix can then be connected to the bias voltage via a first external resistor R1ext. The first external resistor R1ext can be a low TCR resistor. The temperature dependence coefficient for the first external resistor R1ext can be approximately ±5 ppm/° C. A bias voltage can be applied to the on-chip resistor Rt at the SiPM cathode via the first external resistor R1ext. The use of the first external resistor R1ext forms a resistive divider for the bias voltage and serves to assist in providing a resulting temperature dependence to the bias voltage applied to the SiPM cathode. The temperature dependence of the bias voltage can be at the same level as the temperature dependence of the SiPM breakdown voltage. The use of the first external resistor R1ext for scaling eliminates the need for the TCR of the on-chip resistor Rt to exactly match the temperature dependence of the SiPM matrix breakdown voltage.

In a second embodiment, the on-chip resistor Rt can be connected to a stable reference voltage via a second external resistor R2ext. The second embodiment can be used for higher light intensities (above approximately 1 million photons per second) or a large SiPM leakage current. The voltage potential at the on-chip resistor Rt is then used to control the output voltage of the bias power supply.

FIG. 1 shows an embodiment of a device 100, such as a photodetector, with a silicon photomultiplier (SiPM). The device 100 includes a SiPM matrix 102 and a resistor Rt (also referred to as a thermistor) fabricated on the same substrate 106. In one embodiment, the substrate 106 can be silicon, but other types of substrates 106 can be used in other embodiments.

There are several types of technological processes that can be used to fabricate the resistor Rt. For example, the resistor Rt can be fabricated using high TCR materials such as amorphous silicon, amorphous silicon carbide, or polycrystalline silicon-germanium with TCR values of about 2.5%/K, 4-6%/K, and 2-3%/K, respectively. In one embodiment, the resistor Rt can be fabricated as an N-well or P-well type CMOS resistor. An N-well type resistor can have a TCR in the range of about 2000 ppm/° C. to about 3000 ppm/° C. In one embodiment, TCR can be expressed as the change in resistance in ppm (0.0001%) with each degree of change in temperature Celsius (° C.). For example, if resistor Rt has a TCR of 2000 ppm/° C., the resistance of Rt can change −2% total over a 10-degree change and 20% total over a 100-degree change. The sheet resistance of an N-well resistor can be about 1 kOhm/square to about 3 kOhm/square that allows fabricating of resistors with high values of the order of about 0.1 to about 10 MOhms and of about 2000 ppm to about 3000 ppm for TCR to keep power consumption low and minimize heating of the substrate 106.

The substrate 106 can have an input connection or terminal 103 (which can also be referred to as the cathode for the SiPM matrix 102) that couples the SiPM matrix 102 and a bias power supply 110 and output connection or terminal 105 (which can also be referred to as the anode for the SiPM matrix 102) that couples the SiPM matrix 102 to an output load (represented by the resistor Rload). The SiPM matrix 102 can include an array of avalanche photodiodes (APDs) operated in Geiger-mode at a reversed bias voltage exceeding the breakdown voltage of the APDs. In one embodiment, the APDs can be operated at an overvoltage value (i.e., the difference between the bias voltage and the breakdown voltage) of between about 2 and about 5 volts (V), although other values are possible. Each of the APDs in the SiPM matrix 102 can be connected in series to corresponding quenching resistors used to reset the APDs after the detection of a single photon event.

In one embodiment, the breakdown voltage of the SiPM matrix 102 can have a temperature dependence that can vary between approximately 649 ppm/° C. to approximately 2065 ppm/° C. The gain and photon detection efficiency of the SiPM matrix 102 can be maintained substantially constant (with respect to temperature changes) if the overvoltage value for the SiPM matrix 102 is kept substantially constant. To keep the overvoltage value substantially constant, the bias voltage applied to the SiPM matrix 102 by the bias power supply 110 can have about the same temperature dependence as the breakdown voltage of the SiPM matrix 102. In other words, the bias voltage provided to the SiPM matrix 102 by the bias power supply 110 can be increased or decreased by an amount that corresponds to an increase or decrease of the breakdown voltage of the SiPM matrix 102 as a result of temperature changes to keep the overvoltage value applied to the SiPM matrix 102 relatively constant.

To provide for the adjustment of the bias voltage applied to the SiPM matrix 102 by the bias power supply 110, a compensation circuit 120 can be used to vary the bias voltage provided to input connection 103 by the bias power supply 110. The compensation circuit 120 can include the resistor Rt on the substrate 106. The resistor Rt can have a temperature dependence coefficient that is greater than the temperature dependence coefficient of the breakdown voltage of the SiPM matrix 102. In one embodiment, the temperature dependence coefficient of resistor Rt can be greater than the temperature dependence coefficient of the breakdown voltage of the SiPM matrix 102 by a factor in the range of about 1.5 to about 10. The resistor Rt can accurately track or sense changes in the temperature of the SiPM matrix 102 since the resistor Rt and the SiPM matrix 102 are on the same substrate 106. In other words, the resistance of resistor Rt can vary based on temperature similar to how the breakdown voltage of the SiPM matrix 102 varies based on temperature. The temperature dependence of resistor Rt can be used by the compensation circuit 120 to adjust the bias voltage applied to the SiPM matrix 102 by the bias power supply 110.

The substrate 106 can have connections or terminals 107 for the resistor Rt to be connected to the compensation circuit 120. In the embodiment shown in FIG. 1, one connection 107 for the resistor Rt can be connected to the input connection 103 for the SiPM matrix 102 and the other connection for the resistor Rt can be connected to ground via a resistor Rgnd. The compensation circuit 120 can also include a resistor R1$ext$ and a noise filtering capacitor C1 coupled to the input connection 103. In one embodiment, the resistor R1$ext$ can be connected in series between the bias power supply 110 and the input connection 103. In another embodiment, both R1$ext$ and Rgnd can be low TCR resistors, e.g., a TCR below about 5 ppm/° C.

The compensation circuit 120 can adjust the bias voltage provided to the input connection 103 by the bias power supply 110 through the use of a resistive divider formed by the resistor Rt, the resistor Rgnd and the resistor R1$ext$. The resistive divider in the compensation circuit 120 can adjust the bias voltage provided by the bias power supply 110 to match changes in the breakdown voltage of the SiPM matrix 102 as a result of changes of temperature. In other words, the voltage drop over resistors Rt and Rgnd (which corresponds to the bias voltage applied to the input connection 103 for the SiPM matrix 102) can have a temperature dependence that is similar to the temperature dependence of the breakdown voltage of the SiPM matrix 102.

Figure 2:
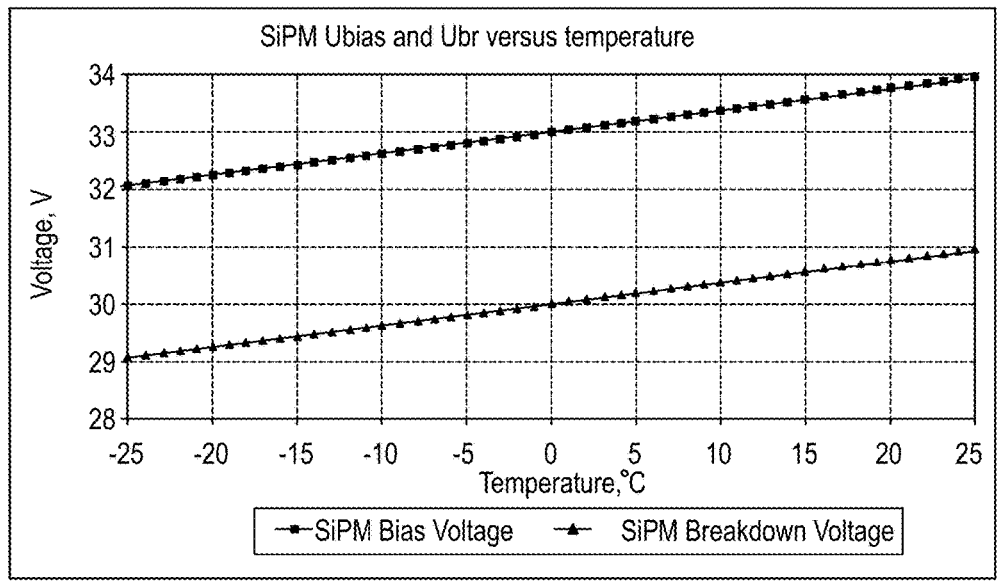
FIG. 2 is a graph showing the SiPM bias voltage and the SiPM breakdown voltage with respect to temperature.
Figure 3:
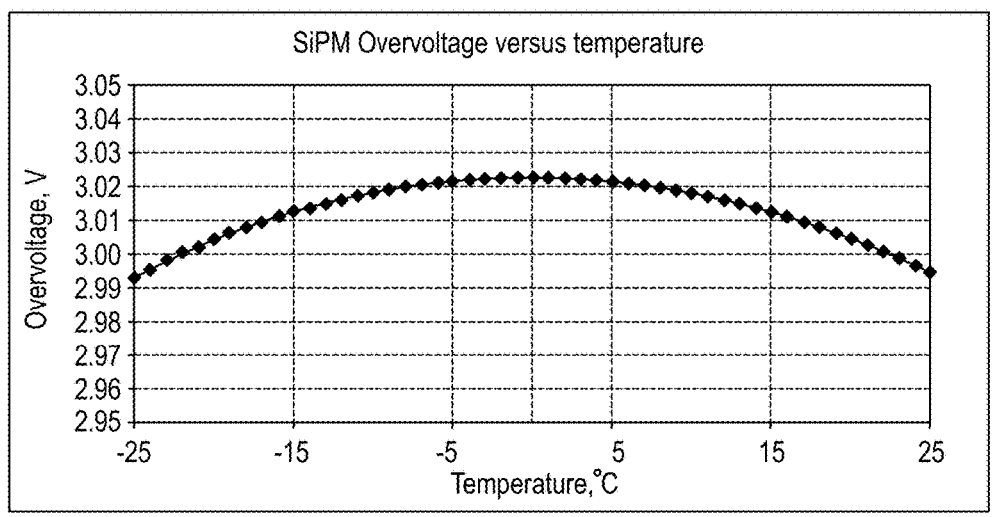
FIG. 3 is a graph showing the SiPM overvoltage (without accounting for SiPM leakage current) with respect to temperature.

FIGS. 2 and 3 show modeled results for the device of FIG. 1. The following values were used for the model: Ubr (the breakdown voltage for the SiPM matrix 102)=30 V at 0° C.; Rt (the resistance for resistor Rt)=1000 kΩ; TCR (the thermal dependence coefficient for resistor Rt)=2500 ppm/° C.; TCU_br (the thermal dependence coefficient for the breakdown voltage of the SiPM matrix 102)=1250 ppm/° C.; R1$ext$ (the resistance for resistor R1$ext$)=1000 kΩ; Rgnd (the resistance for resistor Rgnd)=66 kΩ; and Ups (the output voltage of the bias power supply 110)=64V. In the model, the resistance for resistor Rgnd was chosen to achieve SiPM overvoltage value 3V. FIG. 2 shows a graph of the SiPM bias voltage (Ubias) and the SiPM matrix breakdown voltage (Ubr) with respect to temperature and without accounting for SiPM matrix leakage current. The graph of FIG. 2 shows how the temperature dependence of the SiPM bias voltage is matched to temperature dependence of the breakdown voltage. The SiPM bias voltage shown in FIG. 2 is the voltage applied to the SiPM matrix 102 at the input connection 103 (or cathode) for the SiPM matrix 102. FIG. 3 shows a graph of the SiPM overvoltage with respect to temperature and without accounting for SiPM matrix leakage current. The SiPM overvoltage is the difference between Ubias and Ubr. As shown in FIG. 3, the SiPM overvoltage change is kept within about 1% for the temperature range of about −25° C. to about +25° C. For the temperature range of about −5° C. to about +5° C., the overvoltage variations are within about 0.04%.

Figure 4:
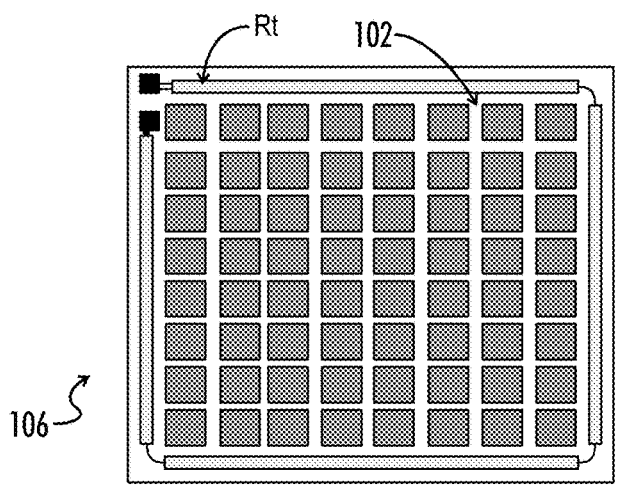
FIG. 4 shows an embodiment of the thermo-compensating resistor on the substrate of FIG. 1.

FIG. 4 shows an embodiment of the thermo-compensating resistor Rt. As shown in FIG. 4, the resistor Rt can be located on the perimeter of the substrate 106. While the embodiment of FIG. 4 shows the resistor Rt on the perimeter of all the sides of the substrate 106, the resistor Rt may be located on the perimeter of fewer than all of the sides of the substrate 106 in other embodiments. In addition, the resistor Rt can be placed on the substrate 106 to at least partially surround the SiPM matrix 102. By having the resistor Rt at least partially surround the SiPM matrix 102, the resistor Rt can more accurately sense the temperature of the SiPM matrix 102. In another embodiment, the resistor Rt can be positioned between pixels or microcells, e.g., avalanche photodiodes, of the SiPM matrix 102 to sense the temperature of the SiPM matrix 102.

Figure 5:
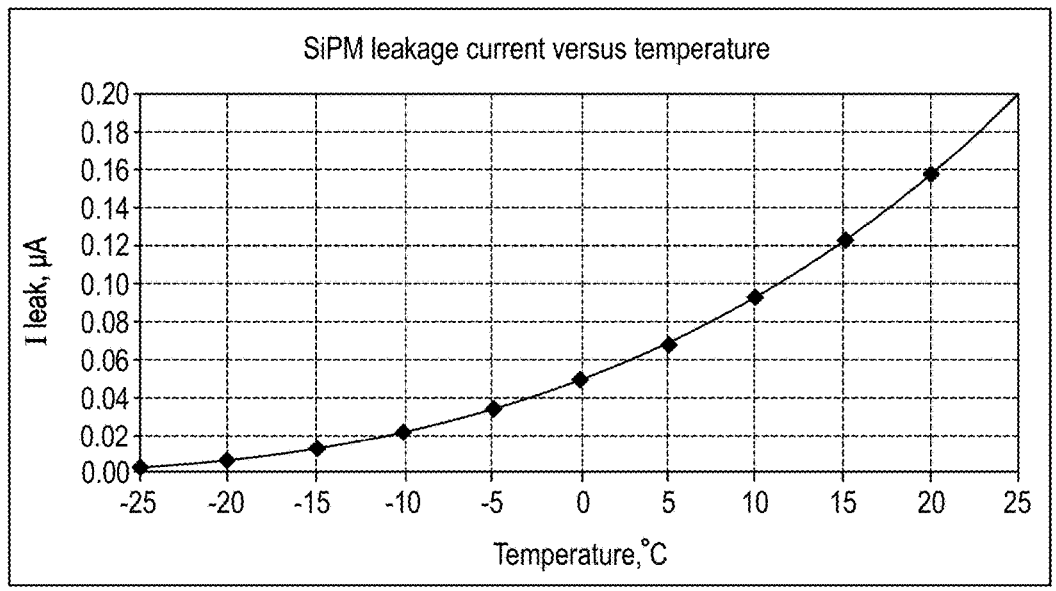
FIG. 5 is a graph of the SiPM leakage current with respect to temperature.
Figure 6:
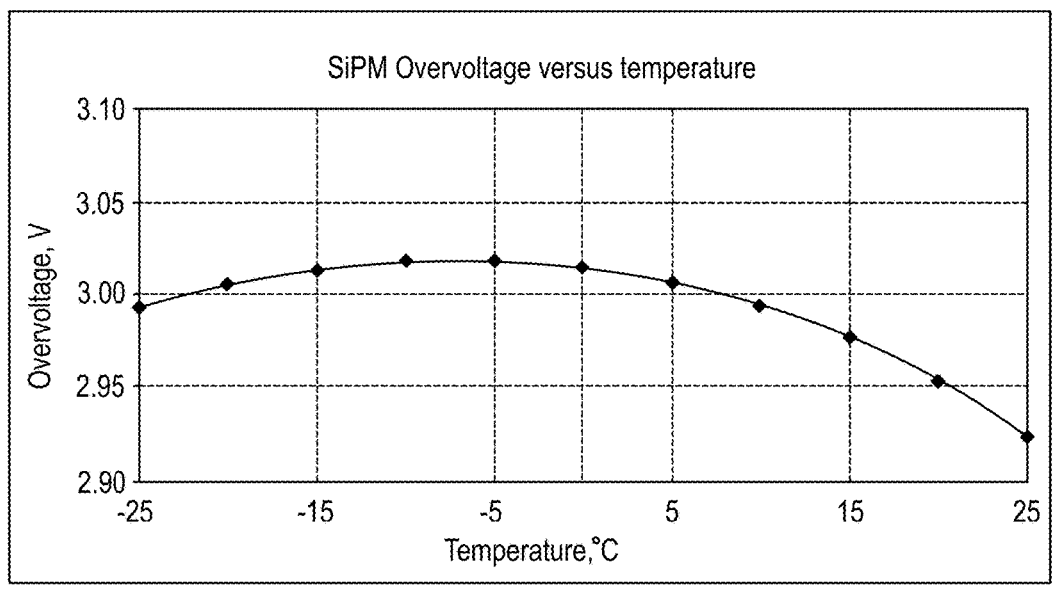
FIG. 6 is a graph showing the SiPM overvoltage (accounting for SiPM leakage current) with respect to temperature.

FIGS. 5 and 6 show modeled results for the device of FIG. 1. The following values were used for the model: Ubr=30 V at 0° C.; Rt=1000 kΩ; TCR=2500 ppm/° C.; TCU_br=1250 ppm/° C.; R1$ext$=985 kΩ; Rgnd=51 kΩ; and Ups=64V. The values for R1$ext$ and Rgnd were adjusted to obtain an SiPM overvoltage value of 3 V. FIG. 5 shows a graph of the SiPM leakage current with respect to temperature at a constant gain for the following parameters measured at 25° C.: Gain=1.2*10$^6$; and Dark counts rate=1 MHz. FIG. 6 shows a graph of the SiPM overvoltage with respect to temperature and accounting for the SiPM leakage current. As shown in FIG. 6, the overvoltage value can be kept within about 0.8% over the temperature range from about −25° C. to about +10° C.

In some embodiments, the SiPM chips 106 can operate at low light intensities and be cooled down in order to reduce noise level. The operation of the SiPM chip 106 under such conditions can consequently reduce leakage current.

Figure 7A:
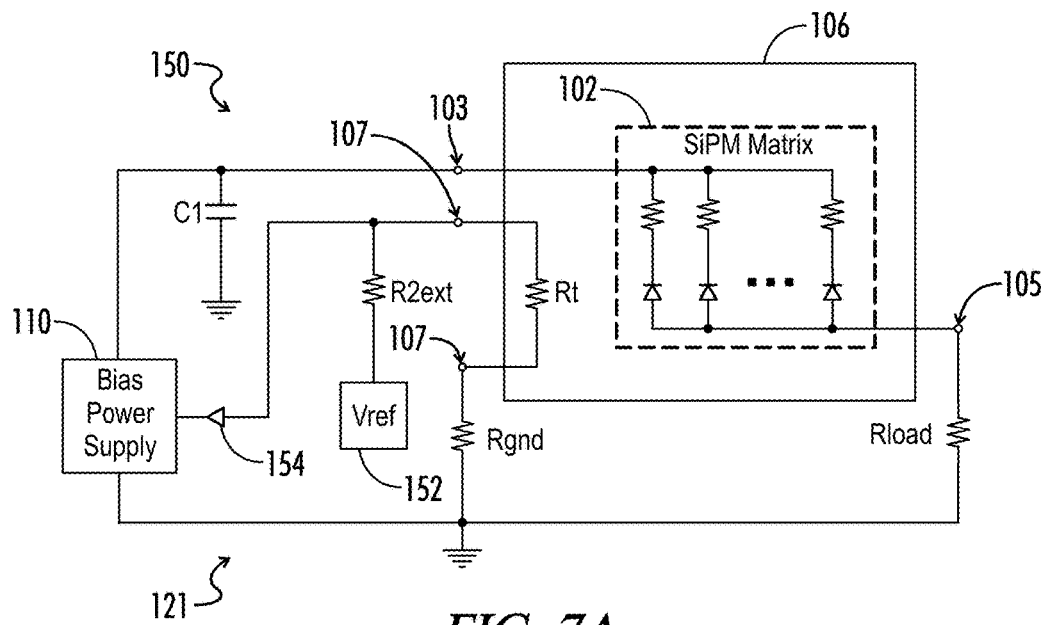
FIGS. 7A and 7B are circuit diagrams of other embodiments of a device with a SiPM.
Figure 7B:
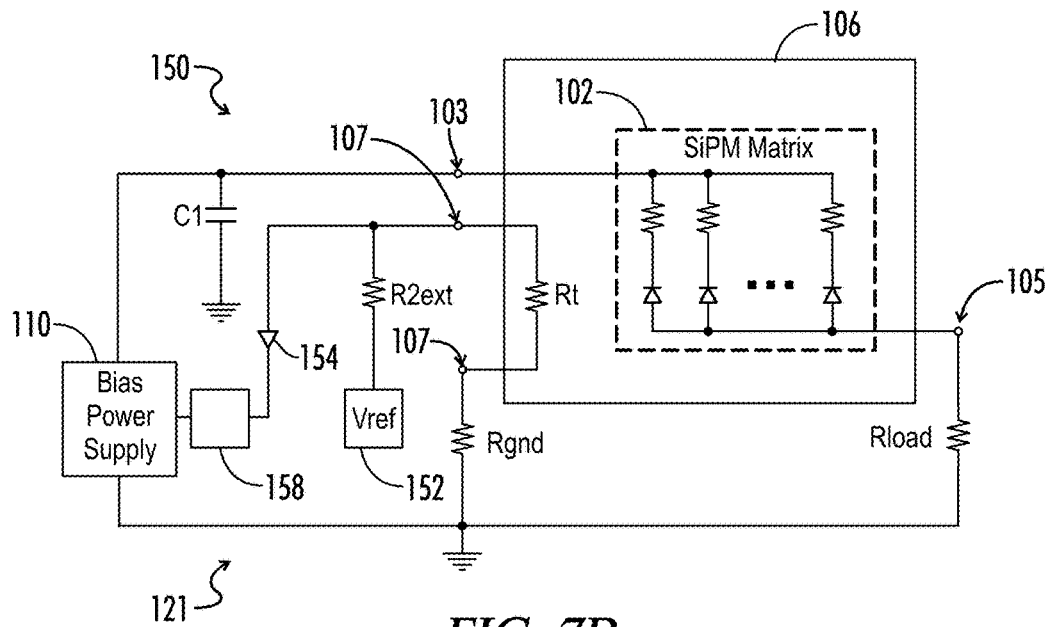

FIGS. 7A and 7B are circuit diagrams of other embodiments of a device 150 with a SiPM. The device 150 shown in FIG. 7A is similar to the device 100 of FIG. 1 except for the use of compensation circuit 121 instead of compensation circuit 120. The compensation circuit 121 can be used to control the voltage output from the bias power supply 110 that then is provided to the input connection 103 for the SiPM matrix 102. The output voltage of the bias power supply 110 provided to the input connection 103 corresponds to the bias voltage for the SiPM matrix 102.

The compensation circuit 121 can include a reference voltage source (Vref) 152 coupled to a resistor R2$ext$. The output voltage level of the reference voltage source 152 can be lower than the SiPM bias voltage in order to lower power dissipation. In one embodiment the output voltage level of the reference voltage source 152 can be from about 2 V to about 5 V. The resistor R2$ext$ has a low temperature dependence and can be coupled to a terminal of an on-chip resistor Rt, which has a large temperature dependence, for example, TCR=2500 ppm/° C. The other terminal of the resistor Rt can be coupled to ground directly or via resistor Rgnd. The joint between the resistor R2$ext$ and the resistor Rt can also be connected to an amplifier 154 that provides an input to the bias power supply 110 to control the voltage output of the bias power supply 110. The amplifier 154 can provide the required gain to achieve the required range of adjustments to the output of the bias power supply 110.

The embodiment of the device 150 shown in FIG. 7B is similar to the embodiment of the device 150 shown in FIG. 7A except for the use of a steering circuit 158 between the amplifier 154 and the bias power supply 110. The steering circuit 158 can be used to control the adjustment of the output of the bias power supply 110 based on the signal from the amplifier 154. In one embodiment, the steering circuit 158 can include transistors and resistors, but in other embodiments additional and/or different components can be used. In the embodiment shown in FIG. 7B the steering circuit 158 is shown as a separate circuit, but the steering circuit 158 can be incorporated into the bias power supply 110 in other embodiments.

The compensation circuits 121 shown in FIGS. 7A and 7B can be used for applications with large SiPM matrix leakage current and large light intensities. The resistors R2$ext$ and Rgnd in compensation circuit 121 can be adjusted to achieve temperature dependence of the voltage (Ubias control) from the bias power supply 110 (relative to the voltage drop over Rt+Rgnd) similar to the temperature dependence of the SiPM breakdown voltage.

In one embodiment, the reference voltage source 152, the amplifier 154 and the steering circuit 158 can be fabricated on the same substrate which holds the SiPM matrix 102 and the resistor Rt. In another embodiment, the resistor R2ext can also be fabricated on the same substrate with the reference voltage source 152, the amplifier 154, the steering circuit 158, the SiPM matrix 102 and the resistor Rt.

Figure 8:
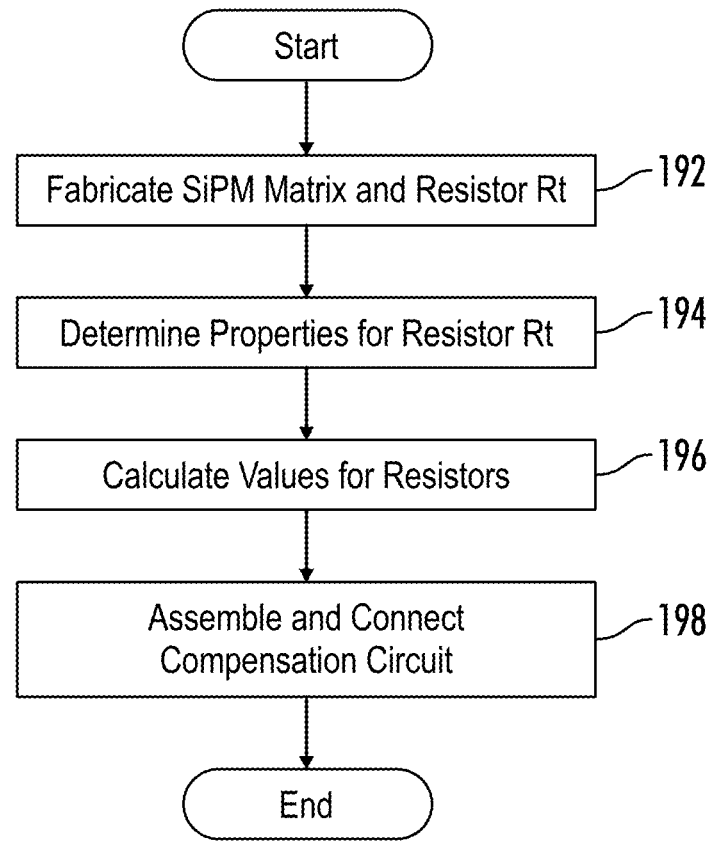
FIG. 8 is a process diagram showing an embodiment for implementing a compensation circuit for a SiPM device.

FIG. 8 shows an embodiment of a process for implementing a compensation circuit 120, 121 for a SiPM device. The process begins by fabricating a silicon chip with the SiPM matrix 102 and the resistor Rt (step 192) on the chip and characterizing the temperature dependence of the SiPM matrix 102. As discussed above, other components such as the steering circuit 158, the amplifier 154 and the reference voltage source 152, if implementing the embodiment of FIG. 7B, may also be fabricated on the silicon chip. Once the silicon chip has been fabricated, the properties for resistor Rt can be determined (step 194). In one embodiment, the resistance of resistor Rt can be measured within the required range of temperatures. After the properties of the resistor Rt are determined, the values for the other resistors of the compensation circuit 120, 121 can be determined (step 196) to obtain a predetermined overvoltage value for the SiPM matrix 102 over the required temperature range.

To define values of R2ext and Rgnd from compensation circuit 121, two temperature dependence characteristics can be created. One characteristic includes the dependence of the SiPM breakdown voltage with respect to temperature. The second characteristic relates to the changing of the bias voltage at the terminal 103 with respect to temperature.

The second characteristic includes the measured characteristic of the resistor Rt over the temperature range, the ratio of the resistive divider formed by resistors R2ext, Rt and Rgnd, the gain of the amplifier 154 and, if used, the steering factor adjustment to the bias power supply 110 provided by the steering circuit 158. Resistors R2ext and Rgnd can be varied until the difference between the two characteristics is minimal over the required temperature range. The overvoltage value can be set by the bias power supply 110. For serial production, the temperature dependence characteristics of Rt and SiPM breakdown voltage can vary insignificantly such that the requirement of measuring the characteristics for each chip over the whole temperature range can be eliminated. The Rt value can be measured at one temperature, for example at 25° C., and corresponding values of R2ext and Rgnd can be calculated proportionally with the ratio of the value of the resistor Rt measured at 25° C. of the device tested over the whole range of temperatures and the value of the resistor Rt measured at 25° C. of the current serially produced device.

In one embodiment, values for Rgnd and R1ext can be determined if the compensation circuit 120 shown in FIG. 1 is being implemented. In another embodiment, values for Rgnd and R2ext can be determined if the compensation circuit 121 shown in FIGS. 7A and 7B is being implemented. Using the determined resistance values, the corresponding compensation circuit 120, 121 can be assembled and connected to the bias power supply 110 to control the bias voltage applied to the SiPM matrix 102 (step 198).

In one embodiment, when resistor Rt is configured as an N-well resistor there can be a significant dependence on the voltage applied over Rt (e.g., 8000 ppm/V) that can result in a cumulative increase in temperature dependence (e.g., 600 ppm/° C.) for resistor Rt when Ubr=30V and resistor Rt has a TCR=2500 ppm/° C.). The voltage dependence of resistor Rt does not change the overall performance of the temperature compensation for the SiPM chip, but external resistors in the compensation circuit 120, 121 may have to be adjusted appropriately. Power deposited on resistor Rt can equal 0.9 mW in one embodiment.

Figure 9:
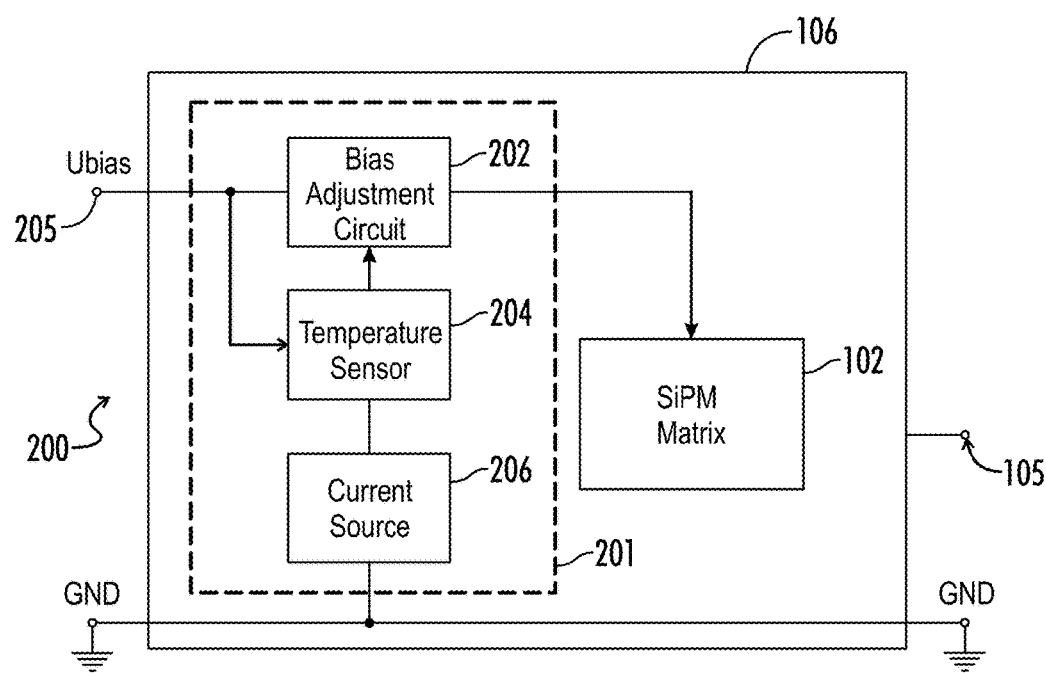
FIG. 9 is a block diagram of an embodiment of a device with a SiPM matrix and a temperature compensation circuit on the same substrate.

FIG. 9 shows an embodiment of a device 200, such as a photodetector, with a SiPM matrix 102 and a temperature compensation circuit 201 fabricated on the same substrate 106. In one embodiment, the substrate 106 can be silicon, but other types of substrates 106 can be used in other embodiments.

The substrate 106 can have an input connection or terminal 205 that couples a bias voltage (Ubias) to the temperature compensation circuit 201 and an output connection or terminal 105 (which can also be referred to as the anode for the SiPM matrix 102) that couples the SiPM matrix 102 to an output load (not shown). The substrate 106 may also include one or more ground connections or terminals (GND) as shown in FIG. 9. The SiPM matrix 102 can include an array of avalanche photodiodes (APDs) operated in Geiger-mode at a reversed bias voltage exceeding the breakdown voltage of the APDs. In one embodiment, the APDs can be operated at an overvoltage value (i.e., the difference between the bias voltage and the breakdown voltage) of between about 2 and about 5 volts (V), although other values for the overvoltage may also be used. Each of the APDs in the SiPM matrix 102 can be connected in series to corresponding quenching resistors used to reset the APDs after the detection of a single photon event.

In one embodiment, the breakdown voltage of the SiPM matrix 102 can have a temperature dependence that can vary between approximately 649 ppm/° C. to approximately 2065 ppm/° C. The gain and photon detection efficiency of the SiPM matrix 102 can be maintained substantially constant (with respect to temperature changes) if the overvoltage value for the SiPM matrix 102 is kept substantially constant. To keep the overvoltage value substantially constant, the bias voltage applied to the cathode of the SiPM matrix 102 by the temperature compensation circuit 201 can have about the same temperature dependence as the breakdown voltage of the SiPM matrix 102. In other words, the bias voltage provided to the SiPM matrix 102 by the temperature compensation circuit 201 can be increased or decreased by an amount that corresponds to an increase or decrease of the breakdown voltage of the SiPM matrix 102 as a result of temperature changes in order to keep the overvoltage value applied to the SiPM matrix 102 relatively constant.

To provide for the adjustment of the bias voltage applied to the SiPM matrix 102 by the temperature compensation circuit 201, a bias adjustment circuit 202 can be used to vary the bias voltage provided to the cathode of the SiPM matrix 102. The bias adjustment circuit 202 can vary the bias voltage provided to the SiPM matrix 102 based on a signal received from the temperature sensor 204. The temperature sensor 204 can accurately track or sense changes in the temperature of the SiPM matrix 102 since the temperature sensor 204 and the SiPM matrix 102 are on the same substrate 106. In other words, the signal provided to the bias adjustment circuit 202 by the temperature sensor 204 can vary based on temperature in a manner similar to how the breakdown voltage of the SiPM matrix 102 varies based on temperature. The temperature dependence of the signal from the temperature sensor 204 can be used by the bias adjustment circuit 202 to adjust the bias voltage applied to the SiPM matrix 102. A current source 206 can be used to provide current to the temperature sensor 204. While the bias adjustment circuit 202 and the current source 206 are shown as fabricated on the substrate 106, one or both of the bias adjustment circuit 202 and the current source 206 do not have to be fabricated on the substrate 106 and can be fabricated elsewhere and coupled to the substrate 106 via one or more terminals.

Figure 10:
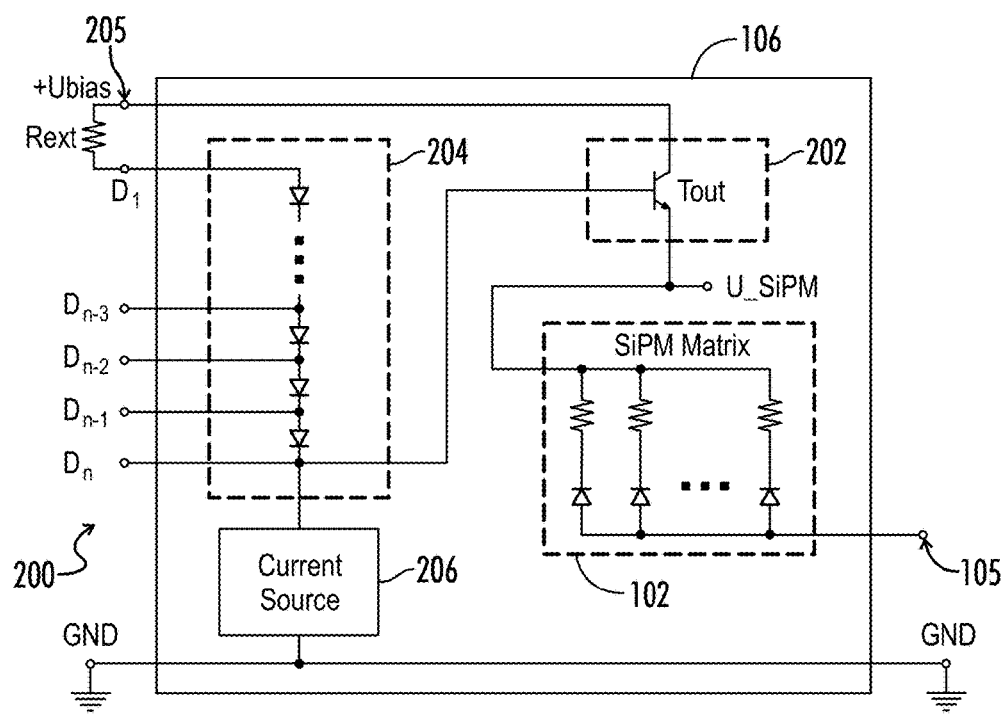
FIG. 10 is a circuit diagram of an embodiment of the device of FIG. 9.
Figure 11:
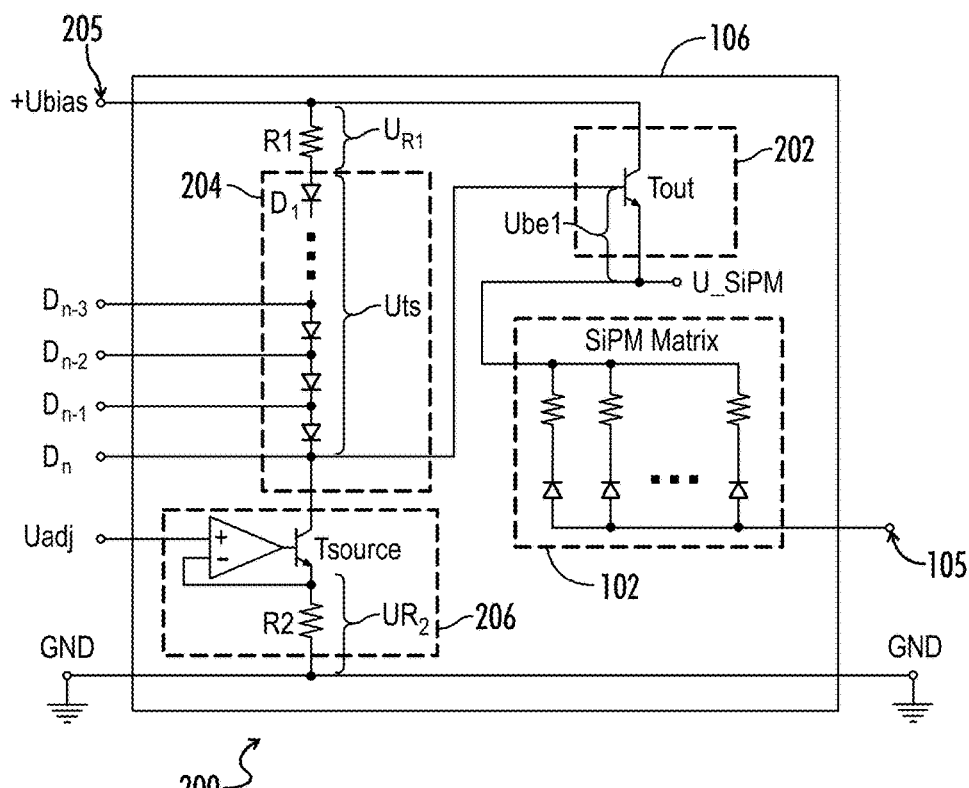
FIG. 11 is a circuit diagram of another embodiment of the device of FIG. 9.

FIGS. 10 and 11 show circuit diagrams of different embodiments of the device 200. As shown in FIGS. 10 and 11, the bias adjustment circuit 202 can include one or more transistors (Tout) to control the bias voltage applied to the SiPM matrix 102. In one embodiment, the transistor Tout can be a bipolar junction transistor. However, in other embodiments, the transistor Tout can include a Darlington transistor, a field-effect transistor or other type of steering circuit. The base of the transistor Tout can be connected to the output of the temperature sensor 204, the collector of the transistor Tout can be connected to terminal 205 to receive the bias voltage Ubias and the emitter of the transistor Tout can be connected to the cathode of the SiPM matrix 102 and provide an input bias voltage (U_SiPM) to the SiPM matrix 102.

The temperature sensor 204 can include a predetermined number of n-p junctions (or p-n junctions), shown in FIGS. 10 and 11 as diodes, that can be serially connected in direct polarity. The anode terminal of the first diode (D1) is connected to terminal 205 and can receive a voltage based on the bias voltage Ubias and the cathode terminal of the last diode (Dn) is connected to the current source circuit 206 and the base of the transistor Tout of the bias adjustment circuit 202. The current source 206 can be used to provide a predetermined current to the temperature sensor 204 and can be based on standard configurations usually implemented in integrated circuits. Each diode can have a forward voltage of about 0.655V and a temperature dependence coefficient for its forward voltage of about −2.35 mV/° C. A number of serially connected diodes can be selected such that the total temperature dependence of the forward voltages of the diodes corresponds to the temperature dependence of the SiPM breakdown voltage but with the opposite sign.

In the embodiments shown in FIGS. 10 and 11, the substrate 106 can include corresponding terminals for at least the last several diodes ($D_n$-$D_{n-3}$) on the side of the diode chain that is connected to the current source 206. The total temperature dependence of the forward voltage of the diode chain can be changed by shorting one or more of the terminals of the diodes in the chain (e.g., coupling the terminal for diode $D_n$ to the terminal for diode $D_{n-2}$ to short out the diodes $D_n$ and $D_{n-1}$) to remove one or more of the corresponding individual −2.35 mV/° C. temperature dependence steps provided by the diodes from the total temperature dependence determination. The inclusion of the external terminals coupled to the diodes permits the adjustment of the thermal characteristics of the device 200, even after the manufacturing of the device 200, by shorting the terminals to remove the temperature dependence steps of one or more diodes if a reduction of the temperature dependence of the bias voltage U_SiPM provided to the SiPM matrix 102 is required in order to maintain a desired overvoltage value.

The signal provided to the bias adjustment circuit 202 by the temperature sensor 204 can correspond to the voltage drop over the plurality of diodes in the temperature sensor 204. The bias adjustment circuit 202 can then combine the signal from the temperature sensor 204 with the input bias voltage U bias to generate the bias voltage U_SiPM for the SiPM matrix 102. In one embodiment, the bias adjustment circuit 202 can subtract the signal from the temperature sensor 204 from the bias voltage U bias to generate the bias voltage U_SiPM for the SiPM matrix 102. The output signal from the temperature sensor 204 can be dependent on the current provided by the current source 206 and the input voltage to the temperature sensor. In one embodiment, the input voltage to the temperature sensor 204 can be based on the bias voltage Ubias.

In some embodiments, several substrates 106 can be used together in a multichannel photodetector configuration. In a multichannel photodetector, the individual SiPM matrices 102 may have slightly different breakdown voltage parameters. If a common Ubias power supply is used to power all the substrates 106, the difference in breakdown voltages can result in different overvoltage levels for individual SiPM matrices 102 and consequently to varying SiPM gains provided by the SiPM matrices 102. The potential variance in overvoltage levels can be corrected by using a single external resistor Rext, as shown in FIG. 10, for each substrate 106. The resistor Rext may be connected in series with the chain (or string) of diodes used in the temperature sensor 204. In the embodiment shown in FIG. 10, the resistor Rext is connected between the terminal 205 providing the bias voltage Ubias and the anode terminal of the first diode (D1) in the string of diodes of the temperature sensor 204. The value of the resistor Rext for each substrate 106 in the multichannel system can be adjusted for each individual SiPM matrix 102 to obtain the same overvoltage value for all SiPM matrices 102 while using a common bias voltage Ubias for the whole multichannel system.

In one embodiment, the value of the resistor Rext for each substrate 106 can be calculated using formula 1:

$$Rext = (Ubr\_var + Umarg)/Isource \qquad (1)$$

In formula 1, Ubr_var can be the variation in breakdown voltage between the SiPM matrices 102. In one embodiment, Ubr_var can be calculated as a difference between the highest breakdown voltage and the lowest breakdown voltage of the SiPM matrices 102 (Ubr_var=Ubr_max−Ubr_min). Umarg can correspond to a predetermined voltage margin and can be any suitable voltage such as 0.5V, 1V or other voltage value. Isource can correspond to the current supplied to the temperature sensor 204 by the current source 206. In one embodiment, Isource can be the same for each substrate 106, but in other embodiments, the value of Isource can vary between substrates 106.

In another embodiment, instead of using the resistor Rext, as shown in FIG. 10, to provide a constant overvoltage to each SiPM matrix 102 in a multichannel system, an external DC voltage signal can be applied to the current source 206 to control the overvoltage provided to each SiPM matrix 102. As shown in FIG. 11, an external DC voltage (Uadj) can be provided to the current source 206 to control the current provided to the temperature sensor 204 by the current source 206. As a result, the voltage drop over resistor R1, which is coupled in series with the diodes of the temperature sensor 204, can be changed proportionally in response to the changes in the current from the current source 206. Since the voltage drop at resistor R1 can be controlled, the bias voltage U_SiPM provided to each SiPM matrix 102 can be adjusted individually to obtain the same overvoltage value for all SiPM matrices 102 by the application of an appropriate DC voltage level Uadj to the current sources 106 instead of tuning of the external resistor values for Rext as required in FIG. 10. In addition, the resistor R1 can be fabricated on the substrate 106 with the temperature sensor 204.

In FIG. 11, the current source 206 can include an operational amplifier having an input coupled to the external DC voltage Uadj and an output coupled to a transistor Tsource. A resistor R2 can be coupled to the emitter of the transistor Tsource to convert the externally supplied DC voltage Uadj into current flowing through R2 which is equal to Uadj/R2. In one embodiment, resistors R1 and R2 can be manufactured to have the same resistance to eliminate any temperature dependence associated with the voltage drop over resistor R1. Voltage $U_{R1}$, the voltage drop over resistor R1, can be equal to the voltage $U_{R2}$, the voltage drop over resistor R2, which can be equal to the voltage Uadj. The voltage $U_{R1}$ can be used to adjust the bias voltage U_SiPM applied at SiPM matrix 102 according to the breakdown voltage of the SiPM matrix 102.

Figure 14:
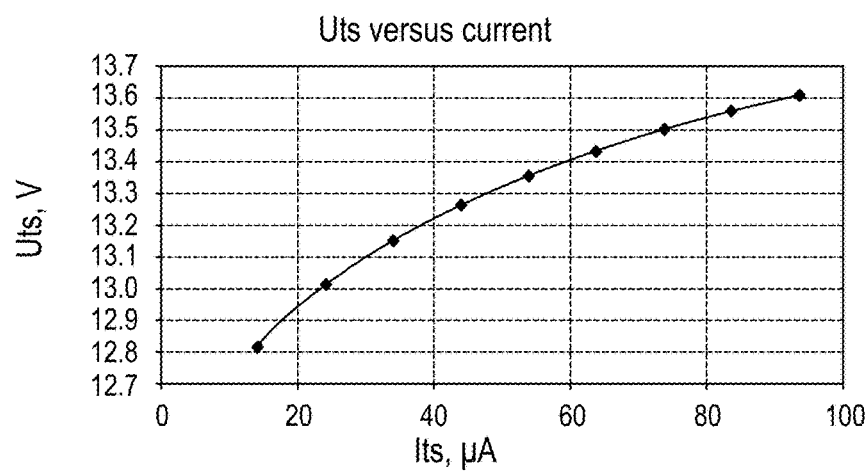
FIG. 14 is a graph showing the voltage drop for the temperature sensor with respect to the current through the temperature sensor.

In one embodiment, the device 200 shown in FIG. 11 can have a SiPM matrix 102 with a SiPM breakdown voltage Ubr=30V and an overvoltage level (Uov) equal to 4V. The voltage drop over the diode string (Uts) of the temperature sensor 204 plus the base-emitter voltage of the transistor Tout (Ube1) can be equal to 13V. The voltage drop over the diode string (Uts) depends on the current flowing though the temperature sensor 204. In an embodiment, the voltage drop Uts measured for 22 serially connected diodes (or p-n junctions) with respect to current measured at 0° C. is shown in FIG. 14. The voltage $U_{R1}$, which is used for adjustment of the bias voltage U_SiPM provided to the SiPM matrix 102 can be equal to 3V. Using the previously defined parameters, the voltage of the external bias source Ubias, which can be common for all SiPM matrices 102 of a multichannel photodetector can be calculated using formula 2:

$$U\text{bias}=U_{R1}+Uts+Ube1+Ubr+Uov=3+13+30+4=50V. \quad (2)$$

The external DC voltage Uadj applied to the current source 206 can be used to adjust the bias voltage (U_SiPM) provided to the SiPM matrix 102 in accordance with the specified breakdown voltage of the SiPM matrix 102. When using equal values of the resistors R1 and R2, the voltage drop over resistor R1 ($U_{R1}$) can be equal to Uadj.

Figure 12:
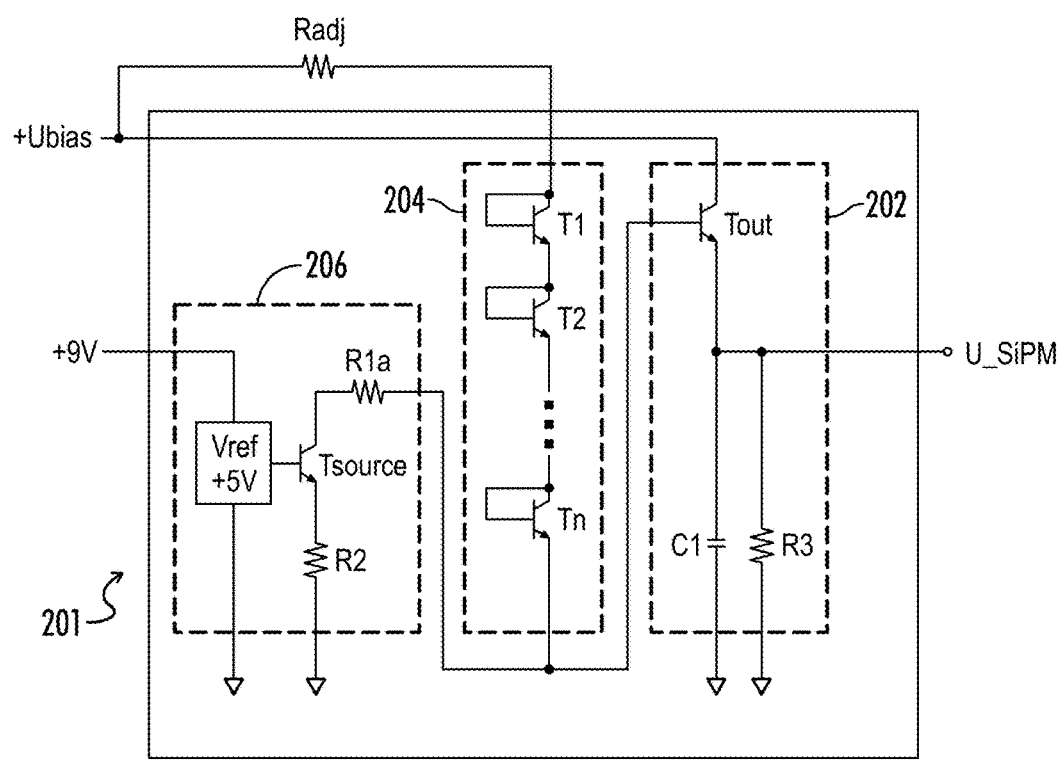
FIG. 12 is circuit diagram of an embodiment of a test prototype for the temperature compensation circuit of FIG. 9.

FIG. 12 shows a circuit diagram for an embodiment of a test prototype for the temperature compensation circuit 201 built using commercially available components. The current source 206 can include a micropower voltage reference chip Vref coupled to a transistor Tsource and resistors R1a and R2 to supply 20 μA current to the temperature sensor 204. The temperature sensor 204 can include a chain of serially connected n-p junctions (or p-n junctions). In the embodiment shown in FIG. 12, serially connected transistors T1 through Tn have their corresponding base-collector terminals shorted and are used to provide the chain of n-p junctions. The transistors T1-Tn can have a temperature dependence of total forward voltage (between collector of T1 and emitter of Tn) that matches the temperature dependence of the breakdown voltage of the SiPM matrix 102 (not shown in FIG. 12). The transistor Tout can be used in the bias adjusting circuit 202. The transistor Tout subtracts an adjusting voltage that is equal to the voltage drop over the chain of serially connected n-p junctions (i.e., transistors T1-Tn) from the bias voltage Ubias provided by an external power supply. The bias adjusting circuit 202 can also include a capacitor C1 and a resistor R3 connected to transistor Tout. Capacitor C1 can be used to filter noise and resistor R3 can be used to define a 10 μA default current via Tout.

Figure 13:
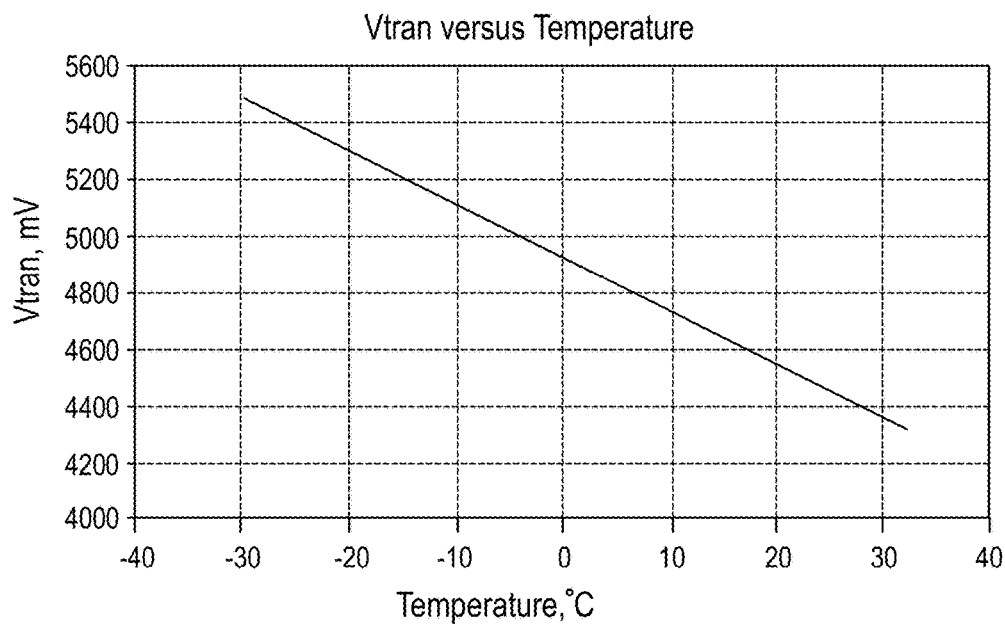
FIG. 13 is a graph showing the temperature dependence of the voltage drop over the serially connected transistors of the temperature compensation circuit of FIG. 12.

To measure the temperature dependence of the serially connected chain of n-p junctions in FIG. 12 over the temperature range of −30° C. to +30° C., 7 transistors were used in the temperature sensor 204 (i.e., transistors T1-T7). In one embodiment, the transistors used in the temperature compensation circuit 201 can all be MMBT5088 NPN general purpose amplifiers by ON Semiconductor, capacitor C1 can have a capacitance of 0.03 nF, resistor R1a can have a resistance of 560 kΩ, resistor R2 can have a resistance of 220 kΩ, and resistor R3 can have a resistance of 3 MΩ. The resistor Radj can have a resistance of 0Ω, thereby permitting the bias voltage Ubias to be provided to the temperature sensor 204. The resulting temperature dependence of the transistor chain (i.e., transistors T1-T7) together with transistor Tout was measured to be −18.71 mV/° C. with each transistor have an individual temperature dependence of −2.35 mV/° C. FIG. 13 shows the relationship between temperature and the voltage drop over transistors T1-T7 and transistor Tout (Vtran) of the temperature compensation circuit 201 of FIG. 12.

In one embodiment, a Hamamatsu SiPM photodetector (type S10362-33-025C) with an active area of 3×3 mm can be assembled with a plastic scintillator BC-490G from Saint-Gobain. The breakdown voltage for the SiPM photodetector can have a temperature dependence of 60 mV/° C. To achieve the required temperature compensation, the temperature compensation circuit 201 of FIG. 12 can include 22 serially connected n-p junctions (i.e., transistors T1-T22) and transistor Tout. The SiPM photodetector can be connected between the U_SiPM terminal shown in FIG. 12 and ground. An Am-241 radioisotope was attached at the scintillator surface. The scintillator with attached radioactive source formed a light source with stable intensity. The SiPM photodetector response was acquired by LeCroy oscilloscope and a pulse amplitude spectrum was built. The spectrum of the base line was acquired along with the collecting of the Am241 amplitude spectrum for subtraction of the offset. This technique allows direct measurement of the temperature dependence of the SiPM gain with better precision than the measurement of the SiPM breakdown voltage temperature dependence.

Figure 15:
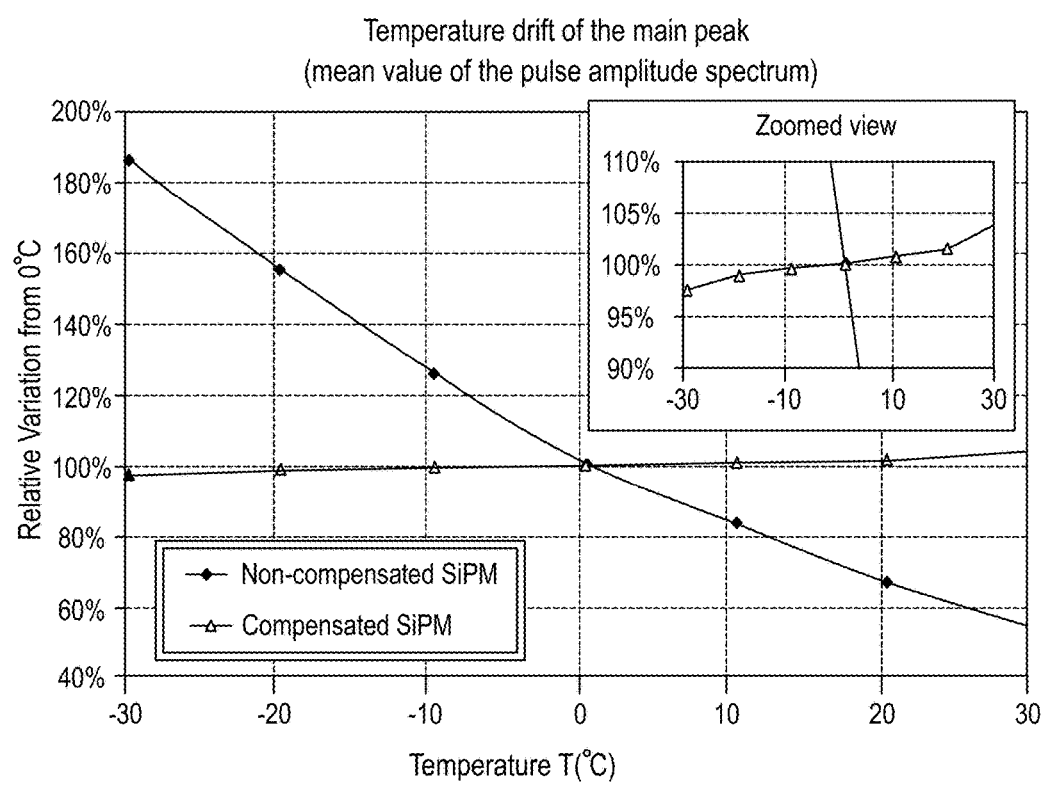
FIG. 15 is a graph showing the relative temperature dependence of the SiPM gain for a SiPM photodetector with and without temperature compensation.

The temperature drift of the mean value of the main peak of acquired amplitude spectrum after subtraction of the base line represents the relative temperature change of the SiPM gain. The relative temperature dependence of the SiPM gain was measured for two cases: without thermo-compensation (i.e., with Ubias applied directly at the SiPM cathode) and with the designed thermo-compensation circuit of FIG. 12 with 23 transistors. Test results acquired in a temperature range of −30° C. to 30° C. are presented in FIG. 15. The relative temperature dependence of the SiPM gain without thermo-compensation was measured equal to −2.2%/° C. at the 0° C. point. The corresponding SiPM gain temperature dependence of the prototype with designed temperature compensation circuit 201 is 0.058%/° C. The temperature compensation circuit 201 improves temperature stability of the SiPM gain by factor 38.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. A silicon photomultiplier (SiPM) device comprising:
   a substrate;
   a SiPM matrix fabricated on the substrate; and
   a temperature sensor fabricated on the substrate with the SiPM matrix, the temperature sensor comprising a plurality of p-n junctions connected in series and configured to provide an output voltage, wherein the output voltage from the plurality of p-n junctions is dependent on temperature and used to adjust a bias voltage applied to the SiPM matrix to maintain a predetermined overvoltage level at the SiPM matrix.

2. The SiPM device of claim 1, wherein:
the substrate comprises an input terminal configured to receive an input voltage and an output terminal coupled to the SiPM matrix; and
the temperature sensor is coupled to the input terminal to receive a voltage based on the input voltage.

3. The SiPM device of claim 2, further comprising a resistor connected between the input terminal and the temperature sensor, wherein the resistor is configured to adjust the voltage received by the temperature sensor.

4. The SiPM device of claim 3, wherein the resistor is fabricated on the substrate.

5. The SiPM device of claim 4, wherein the input terminal is a first input terminal, the input voltage is a first input voltage, the substrate comprises a second input terminal to receive a second input voltage, and the SiPM device further comprising a current source fabricated on the substrate, the current source coupled to the temperature sensor and the second input terminal, the current source configured to provide a predetermined current to the temperature sensor based on the second input voltage.

6. The SiPM device of claim 5, wherein the current source comprises an operational amplifier coupled to the second input terminal and a transistor coupled to the operational amplifier and the temperature sensor.

7. The SiPM device of claim 2, further comprising a compensation circuit fabricated on the substrate, the compensation circuit coupled to the temperature sensor and the input terminal, the compensation circuit configured to adjust the bias voltage applied to the SiPM matrix based on the output voltage from the plurality of p-n junctions and the input voltage provided to the input terminal.

8. The SiPM device of claim 7, wherein the compensation circuit comprises a transistor, the transistor configured to combine the output voltage from the plurality of p-n junctions and the input voltage from the input terminal to generate the bias voltage applied to the SiPM matrix.

9. The SiPM device of claim 1, further comprising a current source fabricated on the substrate, the current source coupled to the temperature sensor and configured to provide a predetermined current to the temperature sensor.

10. The SiPM device of claim 1, wherein the plurality of p-n junctions comprises a plurality of diodes.

11. The SiPM device of claim 1, wherein the plurality of p-n junctions comprises a plurality of transistors.

12. The SiPM device of claim 1, wherein the output voltage provided by the plurality of p-n junctions is based on an individual voltage provided by each p-n junction of the plurality of p-n junctions.

13. The SiPM device of claim 12, wherein the substrate comprises a plurality of input terminals, each input terminal of the plurality of input terminals coupled to a pair of adjacent p-n junctions of the plurality of p-n junctions, wherein a pair of terminals of the plurality input terminals are configured to bypass at least one p-n junction of the plurality of p-n junctions by shorting the pair of terminals to adjust the output voltage provided by the plurality of p-n junctions.

14. A photodetector comprising:
a plurality of substrates, the plurality of substrates comprising a first substrate and a second substrate, each of the first substrate and the second substrate having an input terminal to receive an input voltage from a voltage source;
a plurality of silicon photomultiplier (SiPM) matrices, the plurality of SiPM matrices comprising a first SiPM matrix fabricated on the first substrate and a second SiPM matrix fabricated on the second substrate;
a plurality of temperature sensors, the plurality of temperature sensors comprising a first temperature sensor fabricated on the first substrate and a second temperature sensor fabricated on the second substrate, each of the first temperature sensor and the second temperature sensor comprising a plurality of diodes connected in series and configured to provide an output voltage, wherein the output voltage from the plurality of diodes is dependent on temperature;
a plurality of current sources, the plurality of current sources comprising a first a first current source fabricated on the first substrate and a second current source fabricated on the second substrate, the first current source coupled to the first temperature sensor to provide a first predetermined current to the first temperature sensor and the second current source coupled to the second temperature sensor to provide a second predetermined current to the second temperature sensor; and
a plurality of adjustment circuits, the plurality of adjustment circuits comprising a first adjustment circuit fabricated on the first substrate and a second adjustment circuit fabricated on the second substrate, the first adjustment circuit coupled to the first temperature sensor and the corresponding input terminal of the first substrate, the first adjustment circuit configured to adjust a bias voltage applied to the first SiPM matrix to maintain a first predetermined overvoltage level at the first SiPM matrix, the bias voltage applied to the first SiPM matrix by the first adjustment circuit based on the output voltage from the plurality of diodes of the first temperature sensor and the input voltage, and
the second adjustment circuit coupled to the second temperature sensor and the corresponding input terminal of the second substrate, the second adjustment circuit configured to adjust a bias voltage applied to the second SiPM matrix to maintain a second predetermined overvoltage level at the second SiPM matrix, the bias voltage applied to the second SiPM matrix by the second adjustment circuit based on the output voltage from the plurality of diodes of the second temperature sensor and the input voltage.

15. The photodetector of claim 14, further comprising:
a plurality of resistors, the plurality of resistors comprising a first resistor connected to the corresponding input terminal of the first substrate and a second resistor connected to a corresponding input terminal of the second substrate;
the first temperature sensor coupled to the corresponding input terminal of the first substrate by the first resistor to receive a voltage based on the input voltage and the second temperature sensor coupled to the corresponding input terminal of the second substrate by the second resistor to receive a voltage based on the input voltage; and
wherein each of the first resistor and the second resistor has a corresponding resistance value such that the first predetermined overvoltage value for the first SiPM matrix is substantially equal to the second predetermined overvoltage level for the second SiPM matrix.

16. The photodetector of claim 15, wherein the first resistor is fabricated on the first substrate and the second resistor is fabricated on the second substrate.

17. The photodetector of claim 14, wherein:
the corresponding input terminal of the first substrate is a first input terminal, the input voltage at the first input terminal is a first input voltage and the first substrate having a second input terminal to receive a second input voltage, and the corresponding input terminal of the second substrate is a third input terminal, the input voltage at the third input terminal is a third input voltage and the second substrate having a fourth input terminal to receive a fourth input voltage; and the first current source coupled to the second input terminal to receive the second input voltage and the second current source coupled to the fourth input terminal to receive the fourth input voltage, wherein each of the first current source and the second current source is configured to provide a corresponding current to the first temperature sensor and the second temperature sensor such that the first predetermined overvoltage value for the first SiPM matrix is substantially equal to the second predetermined overvoltage level for the second SiPM matrix.

18. A method for operating a silicon photomultiplier (SiPM), the method comprising:
providing a bias voltage to a SiPM matrix fabricated on a substrate with an adjustment circuit fabricated on the substrate, wherein the bias voltage applied to the SiPM matrix results in a predetermined overvoltage level at the SiPM matrix;

measuring a temperature at the SiPM matrix with a temperature sensor, wherein the temperature sensor is fabricated on the substrate;

providing a voltage to the adjustment circuit by the temperature sensor, wherein the provided voltage is indicative of the measured temperature;

adjusting, with the adjustment circuit, the bias voltage provided to the SiPM matrix in response to a change in the voltage provided to the adjustment circuit by the temperature sensor, wherein in a change in the voltage provided to the adjustment circuit by the temperature sensor corresponds to a change in the measured temperature, and wherein the adjustment of the bias voltage by the adjustment circuit maintains the predetermined overvoltage level at the SiPM matrix.

19. The method of claim 18, further comprising providing a current to the temperature sensor with a current source, wherein the current source is fabricated on the substrate with the temperature sensor.

20. The method of claim 18, wherein the providing the bias voltage to the SiPM matrix includes combining the provided voltage from the temperature circuit with an input voltage provided to the adjustment circuit by a terminal on the substrate.

\* \* \* \* \*